US008497966B2

(12) United States Patent
Choi et al.

(10) Patent No.: US 8,497,966 B2
(45) Date of Patent: Jul. 30, 2013

(54) FFS TYPE TFT-LCD ARRAY SUBSTRATE AND MANUFACTURING METHOD THEREOF

(75) Inventors: Seungjin Choi, Beijing (CN); Youngsuk Song, Beijing (CN); Seongyeol Yoo, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 376 days.

(21) Appl. No.: 12/836,028

(22) Filed: Jul. 14, 2010

(65) Prior Publication Data

US 2011/0013130 A1    Jan. 20, 2011

(30) Foreign Application Priority Data

Jul. 16, 2009  (CN) .......................... 2009 1 0089384

(51) Int. Cl.
*G02F 1/1343* (2006.01)
(52) U.S. Cl.
USPC ........................................................ 349/141
(58) Field of Classification Search
USPC ........................................................ 349/141
See application file for complete search history.

(56) References Cited

U.S. PATENT DOCUMENTS

| | | | |
|---|---|---|---|
| 2005/0110931 A1* | 5/2005 | Yoo et al. | 349/141 |
| 2007/0058121 A1* | 3/2007 | Yamazaki et al. | 349/141 |
| 2007/0146607 A1* | 6/2007 | Lee et al. | 349/141 |
| 2007/0268440 A1* | 11/2007 | Nagano | 349/141 |
| 2008/0158457 A1 | 7/2008 | Park et al. | |
| 2008/0303024 A1* | 12/2008 | Song et al. | 257/59 |
| 2009/0290083 A1* | 11/2009 | Lim et al. | 349/46 |

FOREIGN PATENT DOCUMENTS

| | | |
|---|---|---|
| CN | 1949040 A | 4/2007 |
| CN | 101211084 A | 7/2008 |

* cited by examiner

*Primary Examiner* — Lauren Nguyen
(74) *Attorney, Agent, or Firm* — Ladas & Parry LLP

(57) ABSTRACT

A manufacturing method for an FFS type TFT-LCD array substrate comprises: depositing a first metal film on a transparent substrate, and form a gate line, a gate electrode and a common electrode line by a first patterning process; depositing a gate insulating layer, an active layer film and a second metal film sequentially and patterning the second metal film and the active layer film by a second patterning process; Step 3 depositing a first transparent conductive film and patterning the first transparent conductive film, the second metal film and the active layer film by a third patterning process; depositing a passivation layer, forming a connection hole by patterning the passivation layer through the fourth patterning process, performing an ashing process on photoresist used in the fourth patterning process, depositing a second transparent conductive layer on the remaining photoresist, and forming a common electrode by a lifting-off process.

6 Claims, 9 Drawing Sheets

FFS TYPE TFT-LCD ARRAY SUBSTRATE AND MANUFACTURING METHOD THEREOF

BACKGROUND

Embodiments of the invention relate to a liquid crystal display array substrate and a manufacturing method thereof.

Thin film transistor liquid crystal displays (TFT-LCDs) are an important type of flat panel displays (FPDs).

TFT-LCDs may be classified into a vertical electrical field type and a horizontal electrical field type depending on the direction of the electrical field by which the liquid crystal is driven. For a vertical electrical field type TFT-LCD, a pixel electrode is formed on an array substrate while a common electrode is formed on a color filter substrate. For a horizontal electrical field type TFT-LCD, both a pixel electrode and a common electrode are formed on an array substrate. Therefore, an additional patterning process for forming the common electrode is required when manufacturing a horizontal electrical filed type TFT-LCD array substrate. A vertical electrical field type TFT-LCD comprises a twist nematic (TN) type TFT-LCD. A horizontal electrical field type TFT-LCD comprises a fringe field switching (FFS) type TFT-LCD and an in-plane switching (IPS) type TFT-LCD. Horizontal electrical field type TFT-LCDs, especially FFS type TFT-LCDs, have advantages such as wide view angles and high aperture ratio and have been widely used in practice.

Currently, an FFS type TFT-LCD array substrate is implemented by forming structural patterns via a plurality of patterning processes. Each patterning process comprises processes such as masking, exposing and developing of photoresist, etching and removing remaining photoresist. An etching process comprises dry etching and wet etching. Therefore, the complexity of a method for manufacturing a TFT-LCD array substrate can be evaluated with the numbers of the employed patterning processes, and reducing patterning processes means decreasing manufacturing cost. A six-patterning process for a FFS TFT-LCD array substrate can comprise: patterning for a common electrode, patterning for a gate line and a gate electrode, patterning for an active layer, patterning for source/drain electrodes, patterning for a through hole, and patterning for a pixel electrode.

A conventional four-patterning process for manufacturing a FFS TFT-LCD array substrate comprises the following steps.

Step 1, depositing a first metal film, and forming a gate line, a common electrode line and a gate electrode by a first patterning process with a normal mask.

Step 2, depositing a gate insulating film, an active layer film, and forming an active layer (including stacked layers of a semiconductor layer and a doped semiconductor layer) pattern by a second patterning process with a normal mask.

Step 3, depositing a first transparent conductive film and second metal film sequentially, and forming a pixel electrode, a source electrode, a drain electrode and a TFT channel by a third patterning with a dual tone mask.

Step 4, depositing a passivation layer and a second transparent conductive layer, forming a passivation layer, a connection hole (used for connection between a common electrode and the common electrode line), a connection hole in a PAD region and the common electrode.

The PAD region is a region where leads of a driving circuit board are connected with the array substrate. Through the connection holes in the PAD region, the leads are electrically connected with the gate lines, a data lines, and the common electrode lines on the array substrate.

In the manufacturing method for the array substrate of the liquid crystal display described above, the patterns including the pixel electrode, the source electrode, the drain electrode and the TFT channel are formed merely by one patterning process. However, it has been found that the current manufacturing method may give rise to failure of degrading the display performance of the liquid crystal display, which is described in detail below.

FIG. 1 is a schematic plan view of a conventional FFS type TFT-LCD array substrate. FIG. 2 is a cross-sectional view taken along line A-A in FIG. 1. FIG. 3A is a cross-sectional view after a first transparent conductive layer and a source/drain metal layer are deposited on the substrate with a gate electrode, a gate insulating layer, an active layer formed thereon. FIG. 3B is a cross-sectional view after performing exposure and developing on photoresist on the structure shown in FIG. 3A. FIG. 3C is a cross-sectional view after the etching process is performed. FIG. 3D is a cross-sectional view after performing an ashing process on the photoresist on the structure shown in FIG. 3C. FIG. 3E is a cross-sectional view after etching the substrate shown in FIG. 3D. FIG. 3F is a cross-sectional view showing a state after removing the photoresist shown in FIG. 3E.

As shown in FIG. 1, the conventional FFS type TFT-LCD substrate comprises: a gate line 1, a data line 2, a thin film transistor (TFT) 3, a pixel electrode 4, a common electrode 6 and a common electrode line 5. The gate line 1 is laterally provided on a transparent substrate 11, and the date line 2 is longitudinally provided on the transparent substrate 11, with a TFT 3 formed at an intersection of the gate line 1 and the data line 2. The TFT 3 is an active switching element. The pixel electrode 4 is a plate-shaped electrode, and the common electrode 6 is a slit electrode. The common electrode 6 is located above the pixel electrode 4 with most part of them overlapped, and can form a horizontal electrical field for driving liquid crystal together with the pixel electrode 4. The common electrode line 5 and the common electrode 6 are connected with each other via a connection hole. It should be noted that the reference number "4" in FIG. 1 does not indicate the elongated slit but the plate-shaped pixel electrode under the slit.

As shown in FIG. 2, the conventional FFS type TFT-LCD array substrate further comprises, in particular, the transparent substrate 11, the pixel electrode 4, the common electrode 6, a gate electrode 12, a gate insulating layer 13, an active layer (comprising an semiconductor layer and an doped semiconductor layer) 14, a first transparent conductive portion 15, a source electrode 16, a drain electrode 17, a TFT channel 18 and a passivation layer 19. The gate electrode 12 and the gate line 1 are formed integrally, the source electrode 16 and the date line 2 are formed integrally, and the drain electrode 17 is connected with the pixel electrode 4 directly. When the gate line 1 is input an ON signal, the active layer 14 become conductive, a data signal from the data line 2 can be transferred from the source electrode 16 to drain electrode 17 via the TFT channel, and is further input into the pixel electrode 4. The pixel electrode 4, after input the data signal, generates an electrical field for rotating liquid crystal, together with the common electrode 6. Since the common electrode 6 has slits, it can form a horizontal electrical field with the pixel electrode 4.

The conventional manufacturing method for the FFS type TFT-LCD array substrate is described by referring FIG. 3A-3F. The method comprises the following steps.

Step 1, sequentially depositing a first transparent conductive film 100 and a source/drain metal film 200 on a substrate 11 formed with a gate line, a gate electrode 12, a gate insulating layer 13 and an active layer 14 thereon, as shown in FIG. 3A.

Step 2, applying a layer of photoresist 1000 on the source/drain metal film 200, and performing exposure and development on the photoresist 1000 with a dual tone mask, wherein the thickness of the photoresist 1000 in a pixel region 40 is thinner than that of the photoresist 1000 in a source electrode region 160, a drain electrode region 170 and a data line region, and there is no photoresist 1000 left in other regions including a TFT channel region, as shown in FIG. 3B.

Step 3, performing a first wet etching on the substrate 11 to remove the source/drain metal film 200, the first transparent conductive film 100 and part of the active layer 14 in the region not covered by the photoresist 1000, so as to form a source drain 16 and a TFT channel 18, as shown in FIG. 3C.

Step 4, performing an aching process on the photoresist 1000, which makes the source/drain metal film 200 exposed, and the photoresist 1000 in the source electrode region 160, the drain electrode region 170 and the data line region remained, as shown in 3D.

Step 5, performing a second wet etching on the substrate 11 to remove the source/drain metal film 200 not covered by the photoresist 1000, so as to form a first transparent conductive portion 15, a pixel electrode 4 and a drain electrode 17, as shown in FIG. 3E.

Step 6, removing the remaining photoresist 1000, as shown in FIG. 3F.

In the above-mentioned Steps 3 and 5, etching performed in a large area for the whole substrate are needed to be performed for two times in order to form the TFT channel, the source electrode, the drain electrode and the pixel electrode. This kind of etching in a large area can only be performed by wet etching, that is to say, the substrate is immersed in an etchant solution, and the portion that is not covered by the photoresist and can be contacted by the etchant is etched. In the above mentioned method, the TFT channel region 180 is wet-etched for two times, i.e., one time in Step 3 when the TFT channel is formed and another one time in Step 5 when the pixel electrode is formed. Since the degree of the wet etching is hard to be controlled, over-etch on the TFT channel occurs easily. Over-etch is an considerable defect for the TFT channel that is important for the array substrate and can widen TFT channel and adversely effect the whole characteristics of the final liquid crystal display.

SUMMARY

An embodiment of the invention provides a manufacturing method for a fringe field switching (FFS) type thin film transistor liquid crystal display (TFT-LCD) array substrate, the array substrate comprising a gate line region, a data line region, a gate electrode region, a common electrode line region, a source electrode region, a drain electrode region, a pixel electrode region and a thin film transistor (TFT) channel region, the method comprising:

Step 1, depositing a first metal film on a transparent substrate, and form a gate line, a gate electrode and a common electrode line by a first patterning process;

Step 2, depositing a gate insulating layer, an active layer film and a second metal film sequentially, and patterning the second metal film and the active layer film by a second patterning process, wherein the active layer film and the second metal film in the data line region, the source electrode region, the drain electrode region and the TFT channel region are retained;

Step 3, depositing a first transparent conductive film and patterning the first transparent conductive film, the second metal film and the active layer film by a third patterning process, so as to form a source electrode, a drain electrode, a TFT channel and a pixel electrode by a third patterning process; and Step 4, depositing a passivation layer, forming a connection hole by patterning the passivation layer through a fourth patterning process, performing an ashing process on photoresist used in the fourth patterning process, depositing a second transparent conductive layer on the remaining photoresist, and forming a common electrode by a lifting-off process.

Another embodiment of the invention provides an FFS type TFT-LCD array substrate manufactured by the above method.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Figure 1:
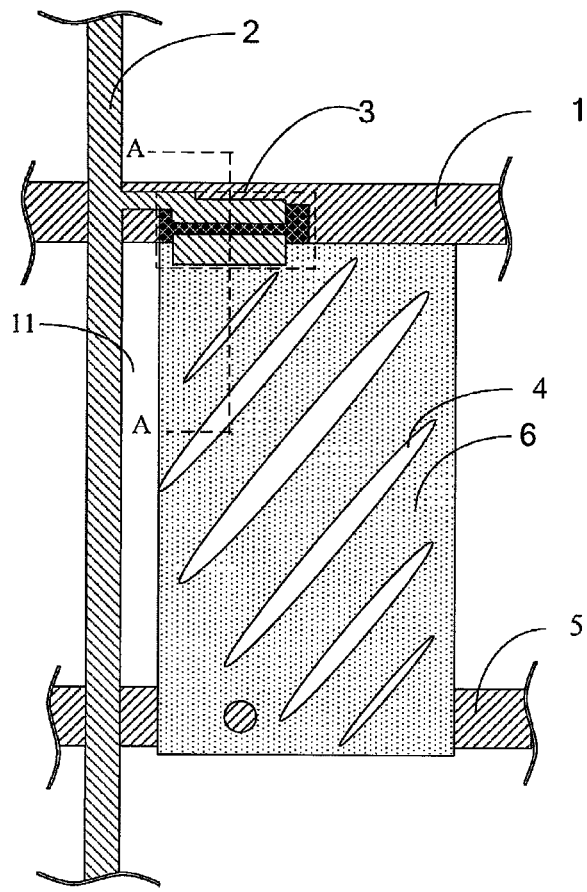
FIG. 1 is a schematic plan view showing a conventional FFS type TFT-LCD array substrate.
Figure 2:
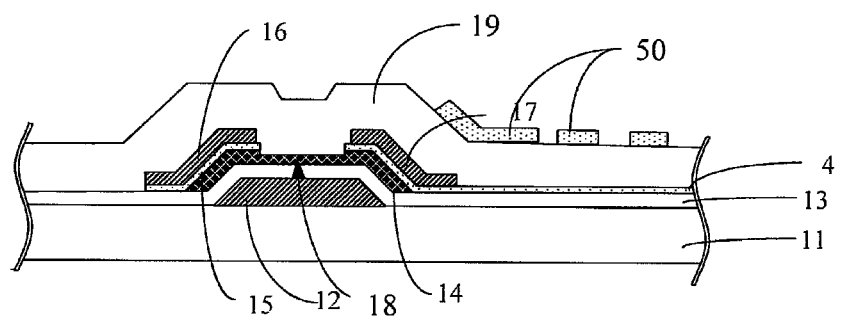
FIG. 2 is a cross-sectional view taken along line A-A in FIG. 1.
Figure 3A:
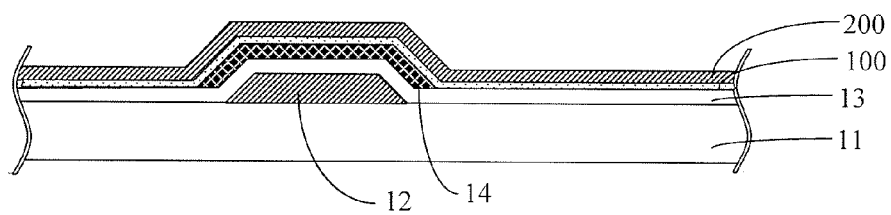
FIG. 3A is a cross-sectional view after depositing a first transparent conductive layer and a source/drain metal layer on a substrate formed with a gate electrode, a gate insulating layer, an active layer thereon.
Figure 3B:
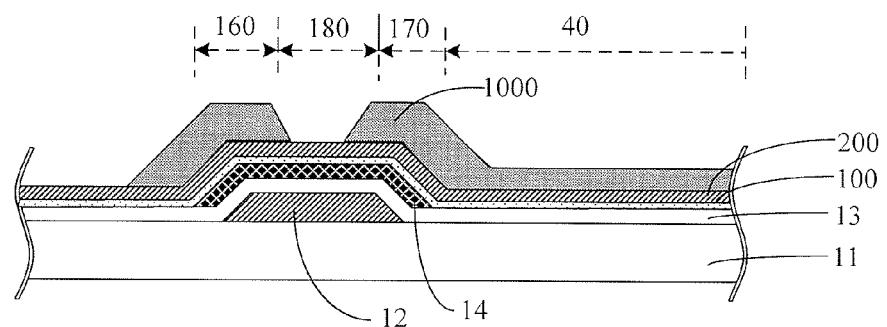
FIG. 3B is a cross-sectional view after performing exposure and developing treatment on the photoresist on the structure shown in FIG. 3A with a dual tone mask.
Figure 3C:
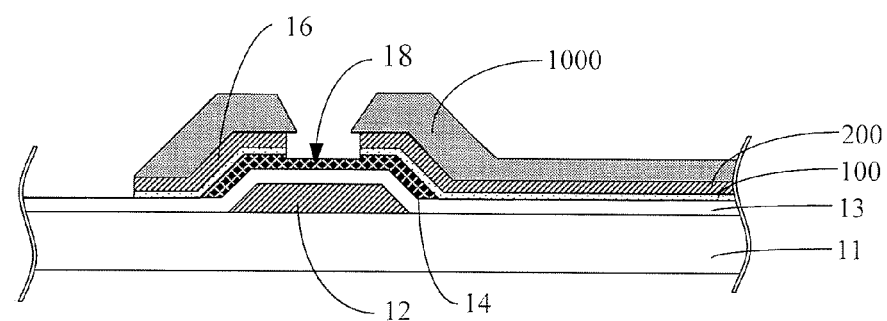
FIG. 3C is a cross-sectional view after performing etching on the structure shown in FIG. 3B.
Figure 3D:
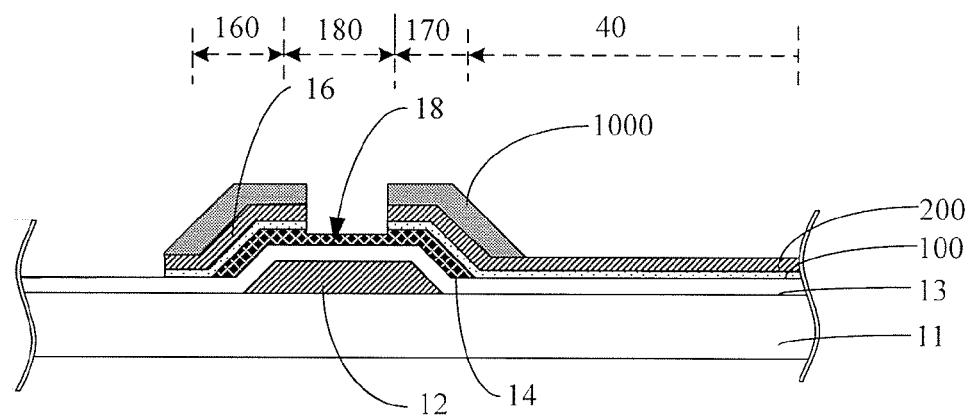
FIG. 3D is a cross-sectional view after performing ashing process on the photoresist on the structure shown in 3C.
Figure 3E:
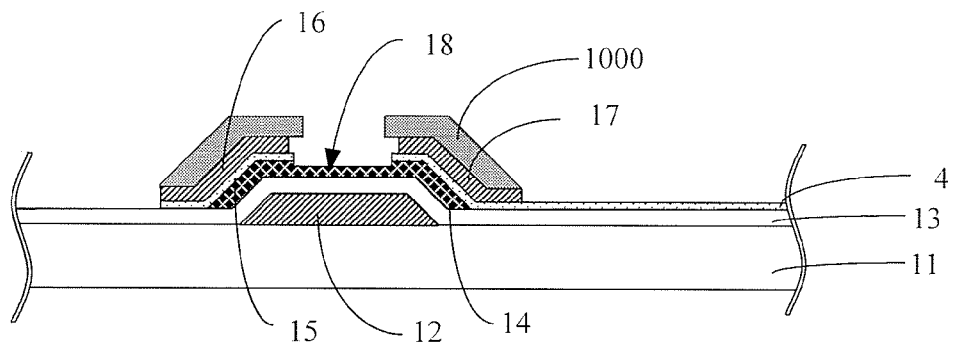
FIG. 3E is a cross-sectional view after etching the substrate shown in 3D.
Figure 3F:
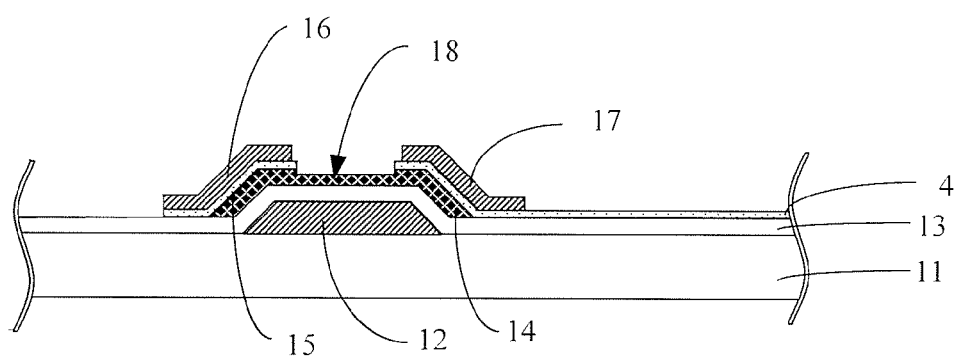
FIG. 3F is a cross-sectional view after removing the photoresist in FIG. 3E.

In the embodiments of the invention, the wording of X being on Y or the like comprises the cases where X contacts with Y or X is provided above Y with an intermediate layer therebetween. For the embodiments of the invention shown in the drawings, a transparent substrate is provided or defined as the lowermost layer.

A patterning process in the embodiments of the invention can comprise applying photoresist, exposing and developing photoresist, etching with a photoresist pattern, and removing remaining photoresist. Positive type photoresist is employed as an example.

The term "X region" in the description means a region on the transparent substrate by vertically projecting the X pattern from up to down, that is to say, the X region has the same shape as the X pattern. For example, a gate line region is a region defined by projecting the pattern of the gate line on the transparent substrate, in other words, it can be comprehended as a region on the transparent substrate, in which the pattern of the gate line is provided.

The embodiments of the invention will be described in detail with reference to the accompanying drawings.

Figure 4A:
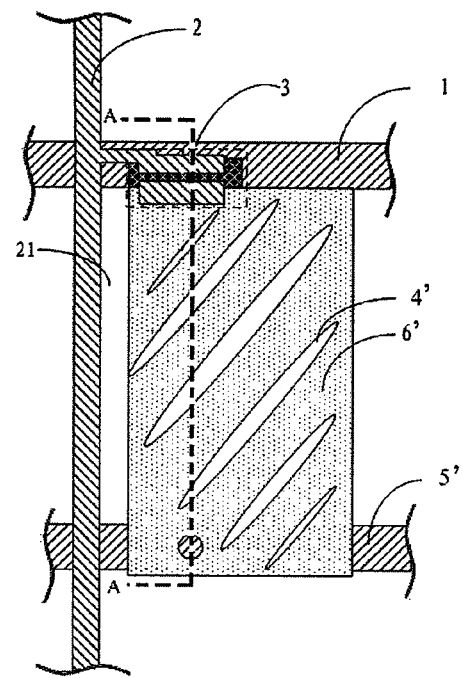
FIG. 4A is a schematic plan view showing a structure of an FFS type TFT-LCD array substrate according to an embodiment of the invention.
Figure 4B:
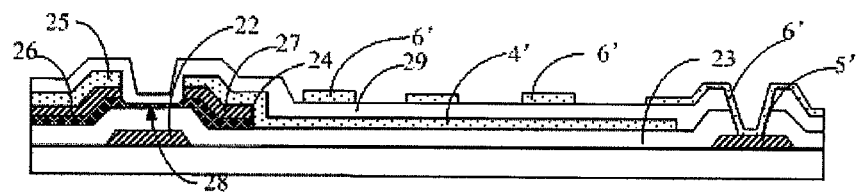
FIG. 4B is a cross-sectional view taken along line A-A in FIG. 4A.

FIG. 4A is a schematic plan view showing a structure of an FFS type TFT-LCD array substrate according to an embodiment of the invention. FIG. 4B is a cross-sectional view taken along line A-A in FIG. 4A. The cross-sectional view is, for example, similar to that taken along line A-A in FIG. 1, but comprises a common electrode line.

As shown in FIG. 4B, the FFS type TFT-LCD array substrate according to the embodiment of the invention mainly comprises: a transparent substrate 21, a gate line (not shown), a gate electrode 22, a common electrode line 5', a gate insulating layer 23, an active layer 24, a source electrode 26, a drain electrode 27, a pixel electrode 4', a second transparent conductive portion 25, a passivation layer 29, and a common electrode 6'. The gate line, the common electrode line 5' and the gate electrode 22 are provided on the transparent substrate 21. The gate insulating layer 23 covers the whole transparent substrate 21 with only a connection hole provided on the common electrode line 5' for connecting the common electrode line 5' with the common electrode 6'. The active layer 24 is provided on the gate insulating layer 23 and located over the gate electrode 22, and is formed with a TFT channel 28. The source electrode 26 and the drain electrode 27 are provided on the active layer 24, and the source electrode 26 and the drain electrode 27 are separated from each other by the TFT channel 28. The second transparent conductive portion 25 is provided on the source electrode 26. One part of the pixel electrode 4' is provided on the drain electrode 27, and connected with the drain electrode 27 directly, the other part is provided on the gate insulating layer 23. The second transparent conductive portion 25, the TFT channel 28 and the pixel electrode 4' are covered by the passivation layer 29 in which a connection hole is provided. The connection hole in the passivation layer 29 and the connection hole in the gate insulating layer 23 are aligned with each other so that the common electrode 6' can be connected with the common electrode line 5'. The common electrode 6' with slits is formed on the passivation layer 29. The common electrode 6' and the pixel electrode 4' are overlapped with each other in the most part so as to generate a horizontal electrical field after being energized.

A four-patterning process is used for manufacturing the FFS type TFT-LCD array substrate according to the embodiment of the invention, the process comprises the following steps.

Step 1, depositing a first metal film on a substrate and forming a gate line, a gate electrode and a common electrode line in the gate line region, the gate electrode region and the common electrode line region, respectively, by a first patterning process.

Step 2, depositing a gate insulating layer, an active layer film and a second metal film sequentially, and patterning the active layer film and the second metal film by a second patterning process, so that the active layer film and the second metal film in the data line region, the source electrode region, the drain electrode region and the TFT channel region are retained, and a data line is formed.

Step 3, depositing a first transparent conductive film and forming a source electrode, a drain electrode, a TFT channel and a pixel electrode by a third patterning process.

Step 4, depositing a passivation layer, forming a connection hole by patterning the passivation layer through the fourth patterning process, performing an ashing process on photoresist used in the fourth patterning process, depositing a second transparent conductive layer on the remaining photoresist, and forming a common electrode by a lifting-off process.

Hereinafter, the manufacturing method for the FFS type TFT-LCD array substrate according to the embodiment of the invention will be in detail described in connection with FIGS. 5-23.

Figure 5:
FIG. 5 is a cross-sectional view after depositing a first metal film on a transparent substrate.

FIG. 5 is a cross-sectional view after depositing a first metal film on a transparent substrate. As shown in FIG. 5, a first metal film 100 is first deposited on a transparent substrate 21 (for example, a glass substrate or a silica substrate) by plasma enhanced chemical vapor deposition (PECVD), magnetic sputtering, thermal evaporation or other film-forming method. The first metal film may be a single-layer film formed of metals such as molybdenum, aluminum, Al—Nd alloy, tungsten, chromium, copper, or a multiple-layer film formed by any combination of the above metals.

Figure 6:
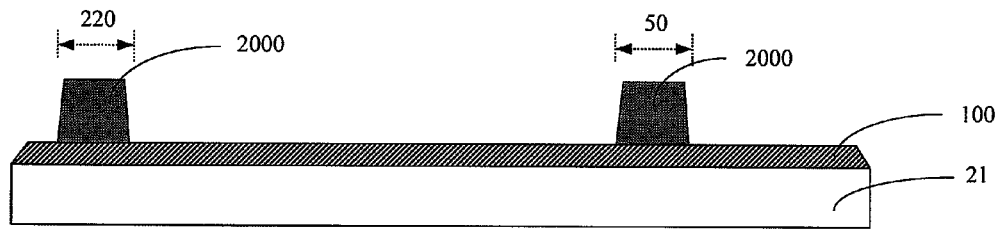
FIG. 6 is a cross-sectional view after performing exposure and developing treatment on photoresist applied on the structure in FIG. 5.

FIG. 6 is a cross-sectional view after performing exposure and developing treatment on photoresist applied on the structure in FIG. 5. As shown in FIG. 6, photoresist 2000 is applied on the first metal film 100, and is exposed with a mask and developed, so that the photoresist 2000 remains in the gate line region (not shown), the gate electrode region 220 and the common electrode line region 50, and does not exist in the other regions.

Figure 7:
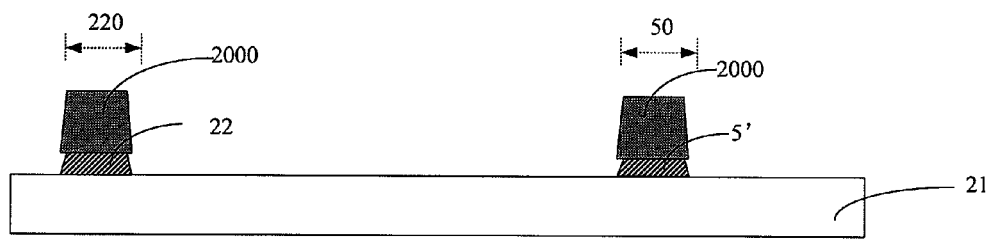
FIG. 7 is a cross-sectional view after performing a first etching process on the structure in FIG. 6.

FIG. 7 is a cross-sectional view after performing a first etching process on the structure in FIG. 6. As shown in FIG. 7, a part of the first metal film 100 not covered by the photoresist 2000 is etched by the first etching process. After the etching, the first metal film 100 is only retained in the gate line region (not shown), the gate electrode region 220 and the common electrode line 50, and the patterns including a gate line, a gate electrode 22, and a common electrode line 5' are formed. In the first etching process, the first metal film 100 can be etched with an etchant made of a mixture of phosphoric acid and nitric acid.

Figure 8:
FIG. 8 is a cross-sectional view after removing the photoresist.

FIG. 8 is a cross-sectional view after removing the photoresist.

As shown in FIGS. 5-8, the first patterning process in the manufacturing method for the FFS type TFT-LCD array substrate according to the embodiment of the invention is implemented here.

Figure 9:
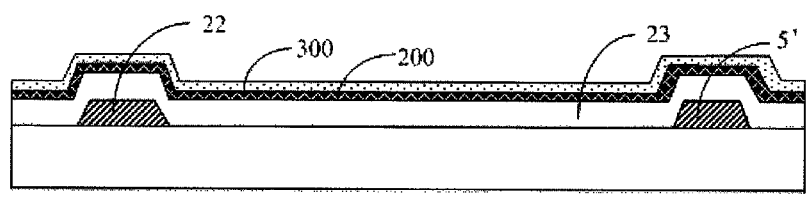
FIG. 9 is a cross-sectional view after depositing a gate insulating layer, an active layer film and a second metal film on the structure in FIG. 8.

FIG. 9 is a cross-sectional view after depositing a gate insulating layer, an active layer film and a second metal film on the structure in FIG. 8. As shown in FIG. 9, the gate insulating layer 23, the active layer film 200 and the second metal film 300 are deposited sequentially. The second metal film 300 may be a single-layer film formed of metals such as molybdenum, aluminum, Al—Nd alloy, tungsten, chromium, copper, or a multiple-layer film formed by any combination of the above metals.

Figure 10:
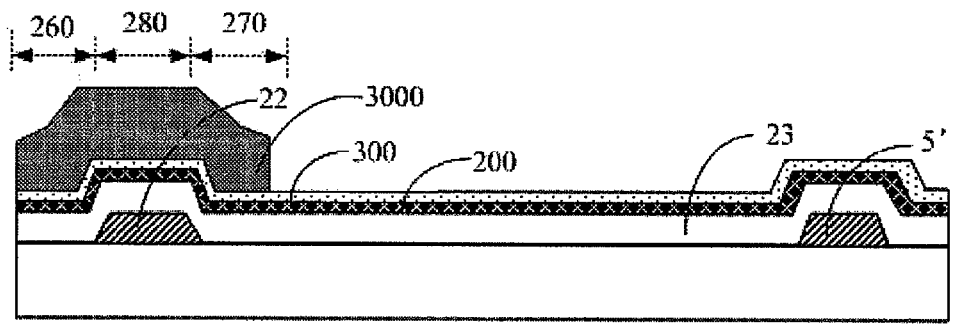
FIG. 10 is a cross-sectional view after performing exposure and developing treatment on the photoresist applied on the structure in FIG. 9.

FIG. 10 is a cross-sectional view after performing exposure and developing treatment on the photoresist applied on the structure in FIG. 9. As shown in FIG. 10, the photoresist 3000 is applied on the second metal film 300, and is exposed with a mask and developed, so that the photoresist is retained in the data line region (not shown), the source electrode region 260, the drain electrode region 270 and the TFT channel region 280 and does exist in the other regions.

Figure 11:
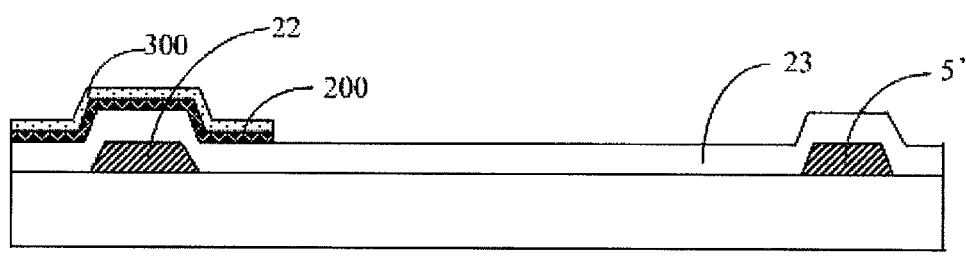
FIG. 11 is a cross-sectional view after performing a second etching process on the structure in FIG. 10.

FIG. 11 is a cross-sectional view after performing a second etching process on the structure in FIG. 10. As shown in FIG. 11, part of the second metal film 300 and the active layer film 200 not covered by the photoresist 3000 is etched by a second etching process, and the second metal film 300 and the active layer film 200 in the data line region (not shown), the source electrode region 260, the drain electrode region 270 and the TFT channel region 280 remains so as to form a pattern of a data line, then the photoresist 300 is removed.

As shown in FIGS. 9-11, the second patterning process in the manufacturing method for the FFS type TFT-LCD array substrate according to the embodiment of the invention is implemented here.

Figure 12:
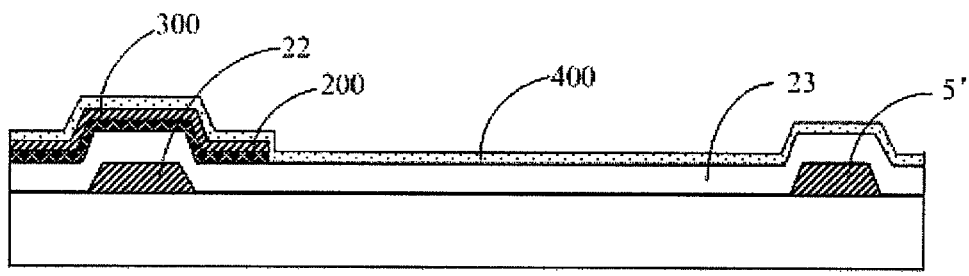
FIG. 12 is a cross-sectional view after depositing a first transparent conductive film on the structure in FIG. 11.

FIG. 12 is a cross-sectional view after depositing a first transparent conductive film on the structure in FIG. 11. As shown in FIG. 12, the first transparent conductive film 400 is deposited on the structure in FIG. 11, and the first transparent conductive film 400 may be indium tin oxide (ITO), indium zinc oxide (IZO), or the like.

Figure 13:
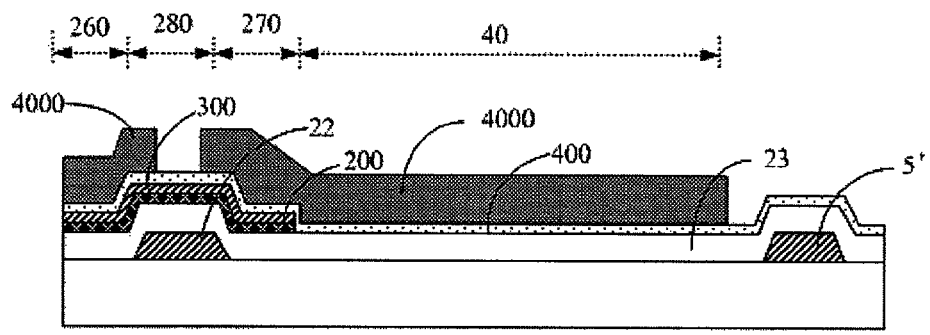
FIG. 13 is a cross-sectional view after performing exposure and developing treatment on the photoresist applied on the structure in FIG. 12.

FIG. 13 is a cross-sectional view after performing exposure and developing treatment on the photoresist applied on the structure in FIG. 12. As shown in FIG. 13, the photoresist 4000 is applied on the first transparent conductive film 400, and is exposed with a mask and developed, so that the photoresist 4000 is retained in the data line region (not shown), the source electrode region 260, the drain electrode region 270 and the pixel electrode region 40 and does exist in the other regions.

Figure 14:
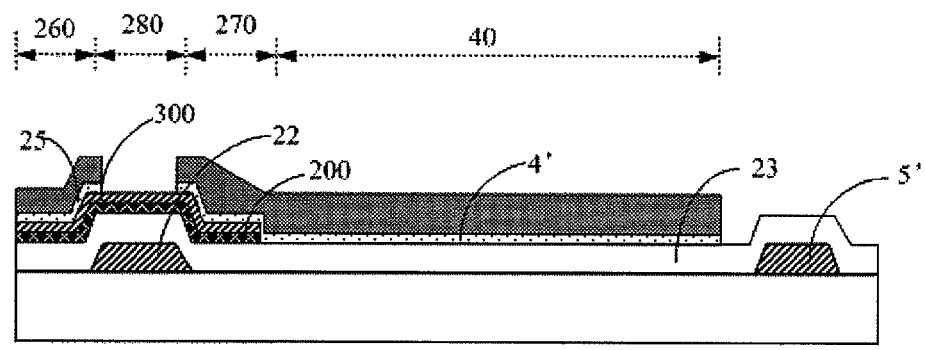
FIG. 14 is a cross-sectional view after performing a third etching process on the structure in FIG. 13.

FIG. 14 is a cross-sectional view after performing a third etching process on the structure in FIG. 13. As shown in FIG. 14, part of the first transparent conductive film 400 not covered by the photoresist 4000 is etched by a third etching process, and the first transparent conductive film 400 in the data line region (not shown), the source electrode region 260, the drain electrode region 270 and the pixel electrode region 40 remains so as to form patterns including a second transparent conductive portion 25 and a pixel electrode 4'.

Figure 15:
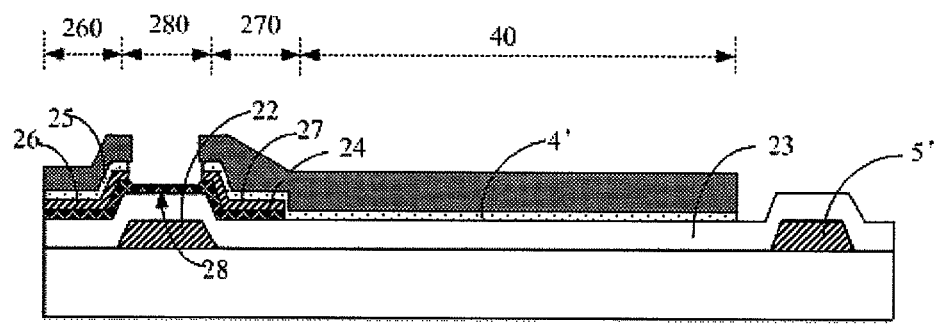
FIG. 15 is a cross-sectional view after performing a fourth etching process and a fifth etching process on the structure in FIG. 14.

FIG. 15 is a cross-sectional view after performing a fourth etching process and a fifth etching process on the structure in FIG. 14. As shown in FIG. 15, the second metal film 300 in the TFT channel region 280 is etched by the fourth etching process, and part of the active layer film 200 (i.e., the doped semiconductor film) in the TFT channel region 280 is also etched by the fifth etching process, so as to form patterns including a source electrode 26, a drain electrode 27, and a TFT channel 28. The second metal film 300 may be etched by an etchant formed of a mixture of phosphoric acid and nitric acid; or it is preferred that the second metal film 300 is etched by a dry etching using a gas etchant. In addition, it is preferred that the doped semiconductor film ($n^+$ a-Si:H) is etched by a dry etching using the gases such as $SF_6$, HCl, $Cl_2$, and He. As the material of the second metal film 300, Mo or Mo/Al/Mo, which can be etched by a dry etching, is preferable. At this time, the dry etching on the doped semiconductor film and the second metal film 300 can be performed continuously, and the etching degree can be controlled accurately so as to prevent over-etch.

Figure 16:
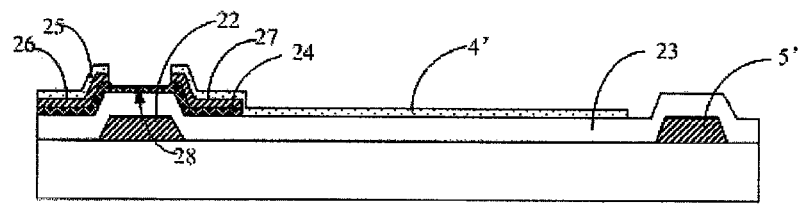
FIG. 16 is a cross-sectional view after removing the photoresist on the structure in FIG. 15.

FIG. 16 is a cross-sectional view after removing the photoresist on the structure in FIG. 15.

As shown in FIGS. 12-16, the third patterning process in the manufacturing method for the FFS type TFT-LCD array substrate according to the embodiment of the invention is implemented here. In the third patterning process according to the embodiment of the invention, since the pixel electrode is first formed and then the TFT channel is formed by etching the TFT channel region, the TFT channel can be etched accurately. Therefore, the failure of over-etch caused in the case where after the TFT channel is formed by etching, the TFT channel is subjected to etching process again when forming the pixel electrode. The parameters of the TFT channel can be ensured and the yield and performance of the liquid crystal display can be improved.

Figure 17:
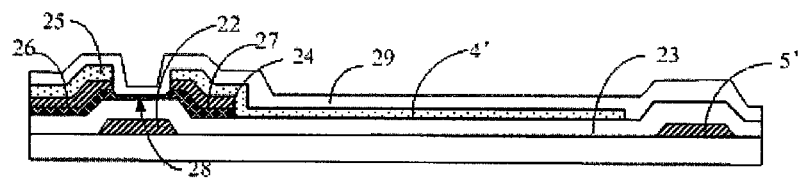
FIG. 17 is a cross-sectional view after depositing a passivation layer on the structure in FIG. 16.

FIG. 17 is a cross-sectional view after depositing a passivation layer on the structure in FIG. 16. As shown in FIG. 17, the passivation layer 29 is deposited on the structure in FIG. 16, and the passivation layer 29 may be a single-layer film of $SiN_x$, $SiO_x$, or $SiO_xN_y$ or a multiple-layer film formed by any combination of the above materials.

Figure 18:
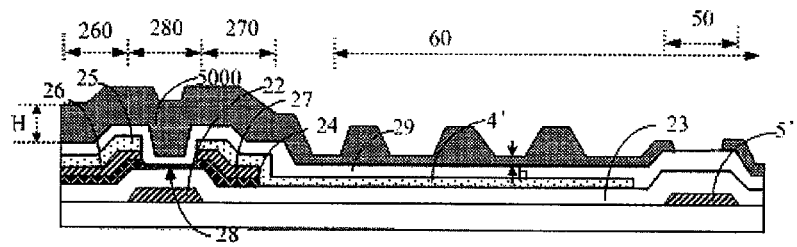
FIG. 18 is a cross-sectional view after performing exposure and developing treatment on the photoresist applied on the structure in FIG. 17.

FIG. 18 is a cross-sectional view after performing exposure and developing treatment on the photoresist applied on the structure in FIG. 17. As shown in FIG. 18, the photoresist 5000 is applied on the passivation layer 29 and is exposed with a dual tone mask and developed, so that the photoresist 5000 in the data line region, the source electrode region 260, the drain electrode region 270, the TFT channel region 280 and part of the common electrode region 60 has a first thickness H, the photoresist 5000 in the common electrode line region 50 has a second thickness h, and there is no photoresist in other regions. The first thickness H is larger than the second thickness h.

Figure 19:
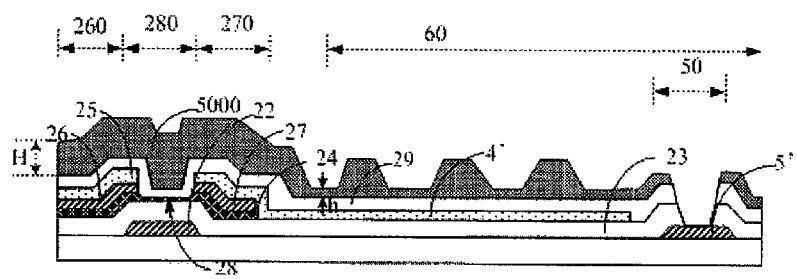
FIG. 19 is a cross-sectional view after performing a sixth etching process on the structure in FIG. 18.

FIG. 19 is a cross-sectional view after performing a sixth etching process on the structure in FIG. 18. As shown in FIG. 19, the passivation layer 29 and the gate insulating layer 23 not covered by the photoresist 5000 is etched by the a sixth etching so as to form a connection hole in the passivation layer 29 and a connection hole in the gate insulating layer 23. At this time, a connection hole in the PAD region (i.e., a region where the gate line, the data line and the common electrode line are connected with the leads of an external driving electrical circuit board) so as to the array substrate may be electrically connected with the driving electrical circuit board.

Figure 20:
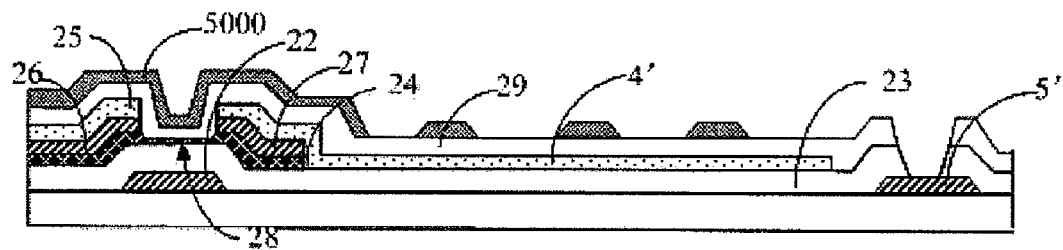
FIG. 20 is a cross-sectional view after performing ashing process on the structure in FIG. 19.

FIG. 20 is a cross-sectional view after performing ashing process on the structure in FIG. 19. As shown in FIG. 20, the ashing process is performed on the photoresist 5000 so as to remove the photoresist 500 with the second thickness h while the photoresist 5000 with the first thickness H is thinned accordingly. Hence, the photoresist 5000 is only retained in the data line region, the source electrode region 260, the drain electrode 270, the TFT channel region 280 and the part of the common electrode region 60 and does not exist in the other regions.

Figure 21:
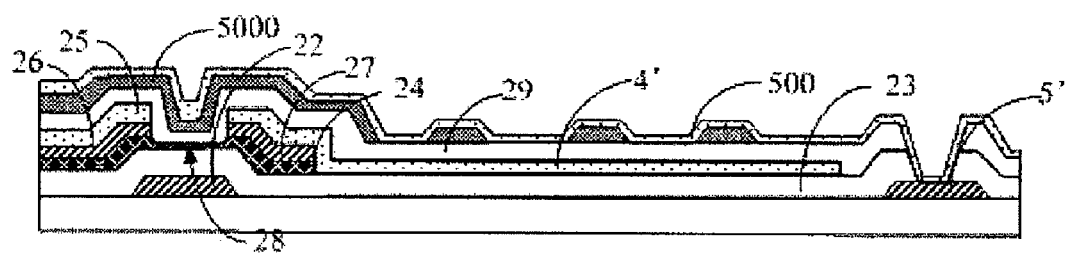
FIG. 21 is a cross-sectional view after depositing a second transparent conductive film 500 on the structure in FIG. 20.

FIG. 21 is a cross-sectional view after depositing a second transparent conductive film 500 on the structure in FIG. 20. As shown in FIG. 21, the second transparent conductive film 500 is deposited on the structure in FIG. 20, and the second transparent conductive film 500 may be formed of ITO, IZO and the like.

Figure 22:
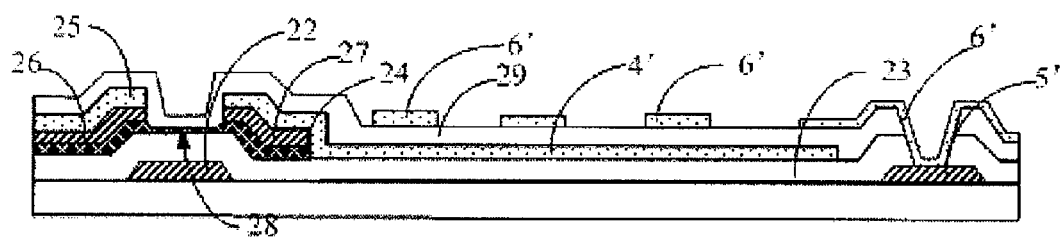
FIG. 22 is a cross-sectional view after performing lifting-off process on the structure in FIG. 21.

FIG. 22 is a cross-sectional view after performing lifting-off process on the structure in FIG. 21. As shown in FIG. 22, the second transparent conductive film 500 on the photoresist 5000 is lifted off together with the remaining photoresist 5000 in a lifting-off process so as to form a pattern of a common electrode 6'.

As shown in FIGS. 17-22, the fourth patterning process in the manufacturing method for the FFS type TFT-LCD array substrate according to the embodiment of the invention is implemented here, and the FFS type TFT-LCD array substrate according to the embodiment of the invention is obtained. Without increasing the numbers of patterning processes, the embodiment of the invention only needs one dual tone mask and reduces the manufacturing cost.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A manufacturing method for a fringe field switching (FFS) type thin film transistor liquid crystal display (TFT-LCD) array substrate, the array substrate comprising a gate line region, a data line region, a gate electrode region, a common electrode line region, a source electrode region, a drain electrode region, a pixel electrode region and a thin film transistor (TFT) channel region, the method comprising:

Step 1, depositing a first metal film on a transparent substrate, and form a gate line, a gate electrode and a common electrode line by a first patterning process;

Step 2, depositing a gate insulating layer, an active layer film and a second metal film sequentially, and patterning the second metal film and the active layer film by a second patterning process, wherein the active layer film and the second metal film in the data line region, the source electrode region, the drain electrode region and the TFT channel region are retained;

Step 3, depositing a first transparent conductive film and patterning the first transparent conductive film, the second metal film and the active layer film by a third patterning process, so as to form a source electrode, a drain electrode, a TFT channel and a pixel electrode by a third patterning process; and Step 4, depositing a passivation layer to cover the source electrode, the drain electrode, the TFT channel and the pixel electrode, forming a connection hole by patterning the passivation layer and the gate insulating layer through a fourth patterning process, and after forming the connection hole, performing an ashing process on photoresist used in the fourth patterning process to remove a part of the photoresist, then depositing a second transparent conductive layer on the remaining photoresist, and forming a common electrode by a lifting-off process, the common electrode being located on the passivation layer so as to overlap with the pixel electrode and connected with the common electrode line through the connection hole.

2. The manufacturing of claim 1, wherein the step 1 comprises:

Step 11, depositing the first metal film on the transparent substrate;

Step 12, applying photoresist on the first metal film;

Step 13, exposing and developing the photoresist so that the photoresist remains in the gate line region, the gate electrode region and the common electrode line region and does not exist in other regions;

Step 14, etching the first metal film not covered by the photoresist in the other regions by a first etching process; and Step 15, removing the remaining photoresist.

3. The manufacturing method of claim 1, wherein the step 2 comprises,

Step 21, depositing the gate insulating layer, the active layer film and the second metal film sequentially, Step 22, applying photoresist on the second metal film;

Step 23, exposing and developing the photoresist so that the photoresist remains in the data line region, the source electrode region, the drain electrode region and the TFT channel region and does not exist in other regions;

Step 24, etching the second metal film and the active layer film not covered by the photoresist in the other regions by a second etching process; and Step 25, removing the remaining photoresist.

4. The manufacturing method claim 1, wherein the step 3 comprises:

Step 31, depositing the first transparent conductive film;

Step 32, applying photoresist on the first transparent conductive film;

Step 33, exposing and developing the photoresist so that the photoresist remains in the data line region, the source electrode region, the drain electrode region and the pixel electrode region and does not exist in other regions;

Step 34, etching the first transparent conductive film not covered by the photoresist in the other regions by a third etching process;

Step 35, etching the second metal film in the TFT channel region by a fourth etching process;

Step 36, etching a part of the active layer film in the TFT channel region by a fifth etching process; and Step 37, removing the remaining photoresist.

5. The manufacturing method of claim 1, wherein the step 4 comprises:

Step 41, depositing the passivation layer;

Step 42, applying photoresist on the passivation layer;

Step 43, exposing with a dual tone mask and developing the photoresist so that the photoresist in the data line region, the source electrode region, the drain electrode region, the TFT channel region and a part of the common electrode region has a first thickness, the common electrode line region is not covered by the photoresist, and the photoresist in other regions has a second thickness, wherein the first thickness is larger than the second thickness;

Step 44, etching the passivation layer and the gate insulating layer in the common electrode line region by a sixth etching process so as to form the connection hole;

Step 45, removing the photoresist with the second thickness by performing the ashing process on the photoresist so that the photoresist only remains in the data line region, the source electrode region, the drain electrode region, the TFT channel region and the part of the common electrode region and does not exist in other regions;

Step 46, depositing a second transparent conductive film; and

Step 47, removing the photoresist remained after the ashing process and the second transparent conductive film thereon by the lifting-off process so as to form the common electrode.

6. A fringe field switching (FFS) type thin film transistor liquid crystal display (TFT-LCD) array substrate manufactured by the manufacturing method of claim 1.

* * * * *